United States Patent
Wu et al.

(10) Patent No.: US 9,025,393 B2
(45) Date of Patent: May 5, 2015

(54) METHOD OF OPTIMIZING SOLID STATE DRIVE SOFT RETRY VOLTAGES

(71) Applicant: LSI Corporation, San Jose, CA (US)

(72) Inventors: Yunxiang Wu, Cupertino, CA (US); Zhengang Chen, San Jose, CA (US); YingQuan Wu, Palo Alto, CA (US); Ning Chen, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 184 days.

(21) Appl. No.: 13/856,179

(22) Filed: Apr. 3, 2013

(65) Prior Publication Data

US 2014/0286102 A1    Sep. 25, 2014

Related U.S. Application Data

(60) Provisional application No. 61/804,853, filed on Mar. 25, 2013.

(51) Int. Cl.
| | |
|---|---|
| G11C 11/56 | (2006.01) |
| G11C 29/42 | (2006.01) |
| G11C 16/00 | (2006.01) |
| G11C 29/02 | (2006.01) |
| G11C 29/50 | (2006.01) |

(52) U.S. Cl.
CPC ............ *G11C 11/5642* (2013.01); *G11C 16/00* (2013.01); *G11C 29/023* (2013.01); *G11C 29/028* (2013.01); *G11C 29/42* (2013.01); *G11C 29/50004* (2013.01)

(58) Field of Classification Search
CPC .. G11C 1/5642; G11C 16/26; G11C 11/5628; G11C 29/42; G11C 29/023; G11C 29/50004; G11C 29/028; G11C 16/00

USPC ............. 365/185.22, 185.2, 185.12, 185.14, 365/185.15, 185.21, 185.03, 185.09, 365/185.18, 185.24, 185.33, 185.19; 714/784, 758, 773, 780, 760
See application file for complete search history.

(56) References Cited

U.S. PATENT DOCUMENTS

| | | | |
|---|---|---|---|
| 7,904,783 B2 * | 3/2011 | Brandman et al. ............ | 714/755 |
| 2011/0231738 A1 | 9/2011 | Horisaki | |
| 2012/0134207 A1 | 5/2012 | Yoon et al. | |
| 2014/0281823 A1 * | 9/2014 | Micheloni et al. ............ | 714/773 |
| 2014/0334228 A1 * | 11/2014 | Kim et al. ............... | 365/185.03 |
| 2014/0355340 A1 * | 12/2014 | Sharon et al. ............ | 365/185.03 |

FOREIGN PATENT DOCUMENTS

JP    2008016092    1/2008

* cited by examiner

*Primary Examiner* — Richard Elms
*Assistant Examiner* — Jerome LeBoeuf
(74) *Attorney, Agent, or Firm* — Suiter Swantz pc llo

(57) ABSTRACT

A method of optimizing solid state drive (SSD) soft retry voltages comprises limiting a number of voltage reads and properly spacing and determining the reference voltage at which each voltage is read based on desired Bit Error Rate (BER) and channel throughput. The method determines each reference voltage for a number of soft retry voltage reads based on a hard decision read. The spacing between each read reference voltage is constant since each SSD type requires a number of reads for an accurate presentation of soft retry voltages. The voltage distance between each successive read is limited to a multiple of the constant spacing while the multiple is based on success or failure of the first read. The method determines a limited number of reads, the constant spacing between reads, and a desired reference voltage for each read, thereby increasing valuable throughput of the channel and decreasing BER.

20 Claims, 6 Drawing Sheets

US 9,025,393 B2

METHOD OF OPTIMIZING SOLID STATE DRIVE SOFT RETRY VOLTAGES

CROSS REFERENCE TO RELATED APPLICATIONS

The present application claims the benefit under 35 U.S.C. §119(e) of U.S. Provisional Application Ser. No. 61/804,853, entitled "Method of Optimizing Solid State Drive Soft Retry Voltages," filed Mar. 25, 2013, which is incorporated herein by reference in its entirety.

FIELD OF THE INVENTION

The present invention relates generally to reliability of flash memory devices. More particularly, embodiments of the present invention relate to determining voltage read values and numbers of read reference voltages to reduce error rates and increase capacity of a channel.

BACKGROUND

Error Correction Code (ECC) production is a task of a Solid State Drive (SSD) controller. Reference voltages at which the SSD controller may command a read of threshold voltages are infinite. Prior attempts at limiting the number of reads and reference voltage at which the SSD controller commands a soft retry voltage read has proven unsuccessful. Therefore, a need remains for a system and method for determining a reference voltage at which a soft retry voltage is read and a spacing between a first voltage read and a second voltage read.

SUMMARY

Embodiments of the present invention provide a method for optimizing solid state drive soft retry voltages, comprising: determining a first reference voltage for a first soft retry voltage read, the first reference voltage based on a hard decision read, reading the first soft retry voltage at the first reference voltage, determining if the first soft retry voltage read fails, determining a spacing between the first reference voltage and reference voltages for each one of a plurality of additional soft retry voltage reads, the spacing based on at least one of: the first soft retry voltage read and a desired bit error rate, the spacing being constant, determining a number of soft retry voltages to be read, the number based on a type of solid state drive, reading a second soft retry voltage from the plurality of additional soft retry voltage reads at a second reference voltage, the second reference voltage at least one iteration of the spacing distant from the first reference voltage, if the first soft retry voltage read fails, reading the second soft retry voltage at a multiple of iterations of the spacing distant from the first reference voltage, the multiple based on an analysis of a characterization data, the multiple greater than or equal to two, reading each one of the plurality of additional soft retry voltage reads at the reference voltages, each of the reference voltages at least one iteration of the spacing distant from a previous reference voltage, and correcting a channel of a memory based on the reading.

It is to be understood that both the foregoing general description and the following detailed description are exemplary and explanatory and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

The following description presents certain specific embodiments of the present invention. However, the present invention may be embodied in a multitude of different ways as defined and covered by the claims. In this description, reference is made to the drawings wherein like parts are designated with like numerals throughout.

Embodiments of the present invention directly apply to a plurality of types of flash memory. Based on how many bits can be stored in a cell, NAND flash is categorized as Single-layer cell (SLC) characterized by a single bit per cell, Multi-layer cell (MLC) characterized by two bits per cell, Triple-layer cell (TLC) characterized by three bits per cell and 4-bit-per-cell flash devices.

Embodiments of the present invention provide for optimum soft retry reference voltage measurements followed by LLR corrections to enable increased capacity of the channel. Goals of the present invention include:
1) A simple concept;
2) Each individual retry is throughput oriented;
3) Overall retry method is BER performance oriented.

Embodiments of the present invention provide for performance based decisions concerning variables to achieve desired capacity of a channel. These variables include: a number of read voltages and whether the number should be constant, a selection of a reference voltage to read a first read voltage, the order and reference voltage for intermediate voltage reads, a reference voltage of a final read voltage, and spacing between each of the intermediate read voltage including whether the spacing is equal or unequal.

Figure 1:
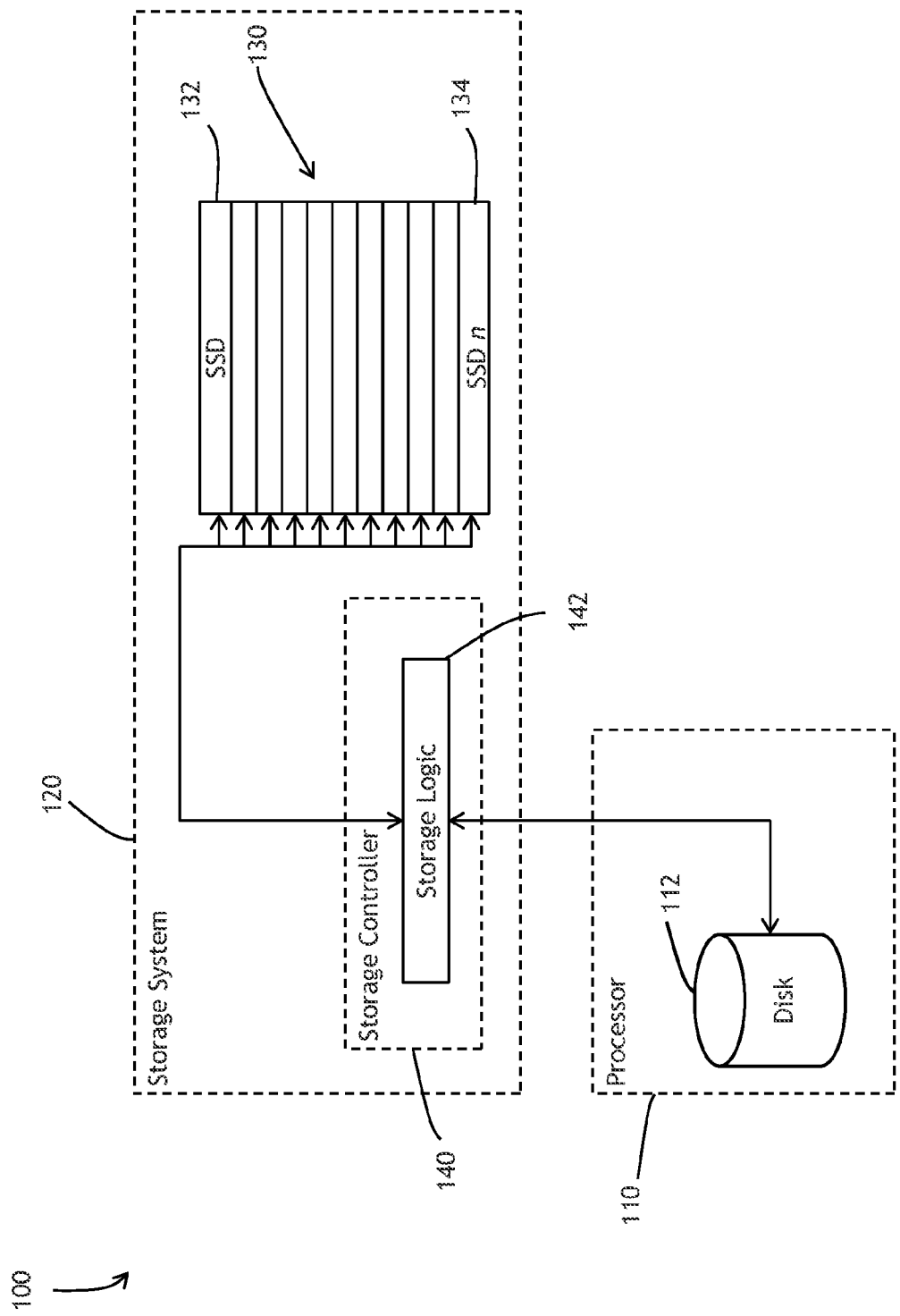
FIG. 1 is a block diagram of an exemplary system for optimizing SSD soft retry voltages in accordance with an embodiment of the present invention.

Referring to FIG. 1, a block diagram of an exemplary system for optimizing SSD soft retry voltages in accordance with an embodiment of the present invention is shown. An exemplary storage system 100 for which the present invention operates comprises processor 110 and storage system 120. Processor 110 includes a disk 112 for requesting information from storage system 120. Within storage system 120, a storage controller 140 includes storage logic 142, a bank of SSDs 130 including a first SSD 132 and n number of SSD 134.

Storage controller 140 is primarily responsible for execution of methods disclosed herein. Alternatively, Processor 110 may function to direct the steps of methods described herein.

Figure 2:
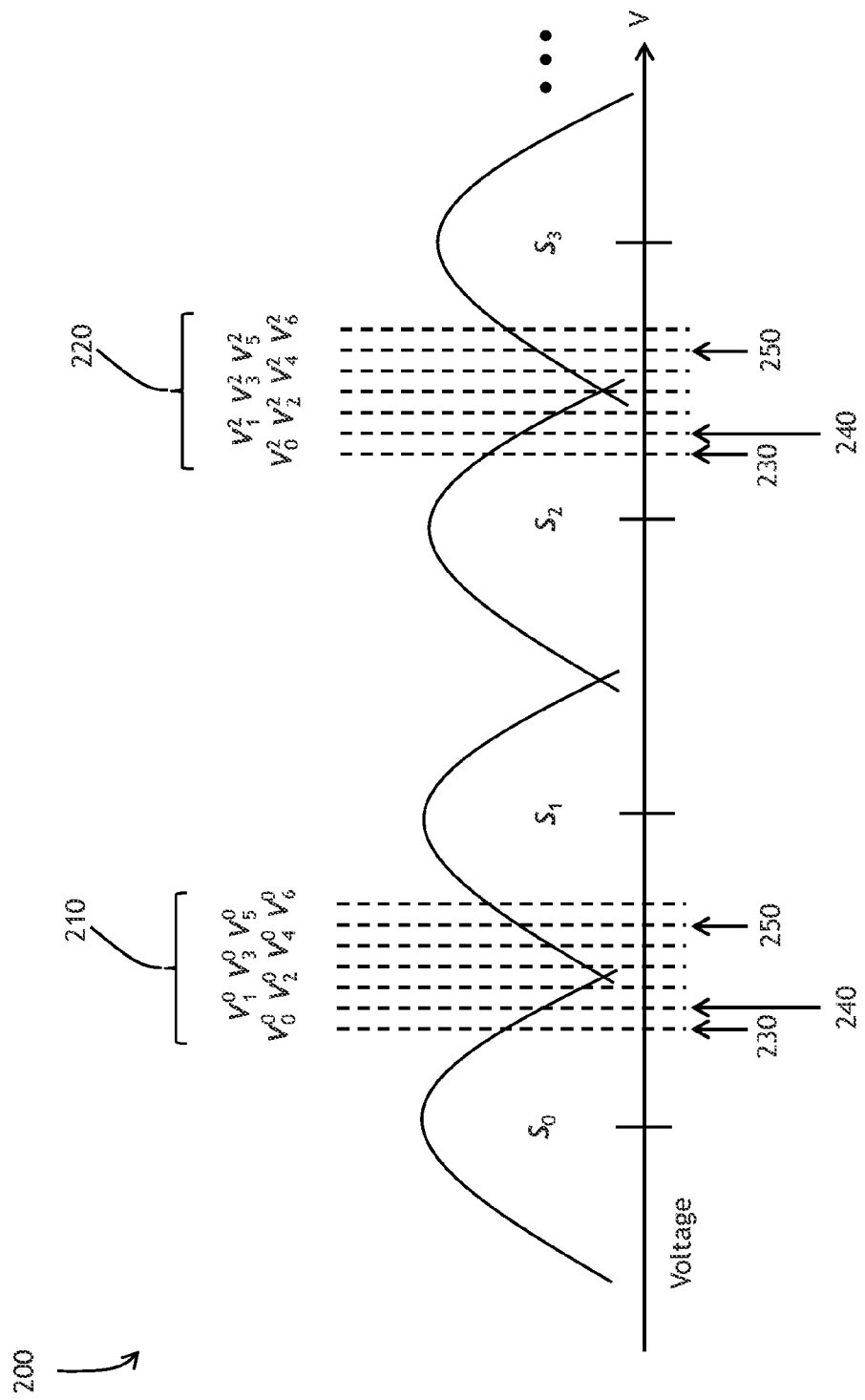
FIG. 2 is a diagram of an exemplary number of reads performed for obtaining a soft decision on a Most Significant Bit (MSB) upper page exemplary of an embodiment of the present invention.

Referring to FIG. 2, a diagram of an exemplary number of reads performed for obtaining a soft decision on a Most Significant Bit (MSB) upper page exemplary of an embodiment of the present invention is shown. Method 200 reads a first group of reads 210, located at a first reference voltage along the distributions of the MLC. Each distribution or Probability Density Function (PDF) of the MLC is labeled $S_0$, $S_1$ etc. Each of the voltages read are labeled $V_0$ through $V_6$ with the first group 210 also labeled $V^0$ and the second group 220 also labeled $V^2$. The first group 210 is exemplary read between $S_0$ and $S_1$ at equally spaced intervals such that there are no reads at the intersection of PDF $S_0$ and PDF $S_1$.

Conversely, the second group 220 is located so a read is placed at the intersection of PDF $S_2$ and PDF $S_3$. Specifically, $V_3^2$ is placed directly at the intersection of the two PDF curves. From each of these groups, method 200 may derive a LLR for the MSB upper page and thus, make corrections to the follow on PDF to enable further capacity of the MSB.

Method 200 also simultaneously reads a pair of read reference voltages in desired circumstances. For example, in reading MSB pages of a MLC flash, method 200 simultaneously applies two read reference voltages. For example, method 200 reads a first pair 230 of read reference voltages at reference voltages $V_0^0$ and $V_0^2$. If this first pair 230 of read reference voltages read fails, method 200 reads a second pair 240 of read reference voltages at a greater or lesser reference voltage from the reference voltage of the first pair. For example, if method 200 increases the reference voltage at which the pair of read reference voltages are read, method 200 may use reference voltages $V_1^0$ and $V_1^2$.

Method 200 has the option of determining the reference voltage at which the second pair of read reference voltages is shifted one or more iterations of the spacing greater or less than the reference voltage of the first pair. For example, should the first pair 230 fail, method 200 may opt to shift the pair one or more iterations of the spacing greater than reference voltage of the first read pair. Should method 200 determine and exemplary five iterations of the spacing are appropriate for the second pair of retry voltages read, pair 250 would be the appropriate pair to read.

Method 200 applies a number of read reference voltages equal to the number of cells of the type of memory in use. For example, for a SLC, a single read reference voltage is sufficient. For an MLC as above, a pair of reads shifted greater or less from the first read pair is sufficient. For a TLC, method 200 applies three reads shifted in parallel. Should the first triple fail, method 200 shifts the triple, in parallel, a number of iterations of the spacing greater or less from the reference voltage of the first read. Similarly, applying method 200 to a four-cell memory, method 200 reads a first quad of reads. Then should the first quad fail, method 200 shifts, in parallel, to a second quad of reads greater or less by an equal amount from the first reference voltages of the first quad of reads.

Figure 3:
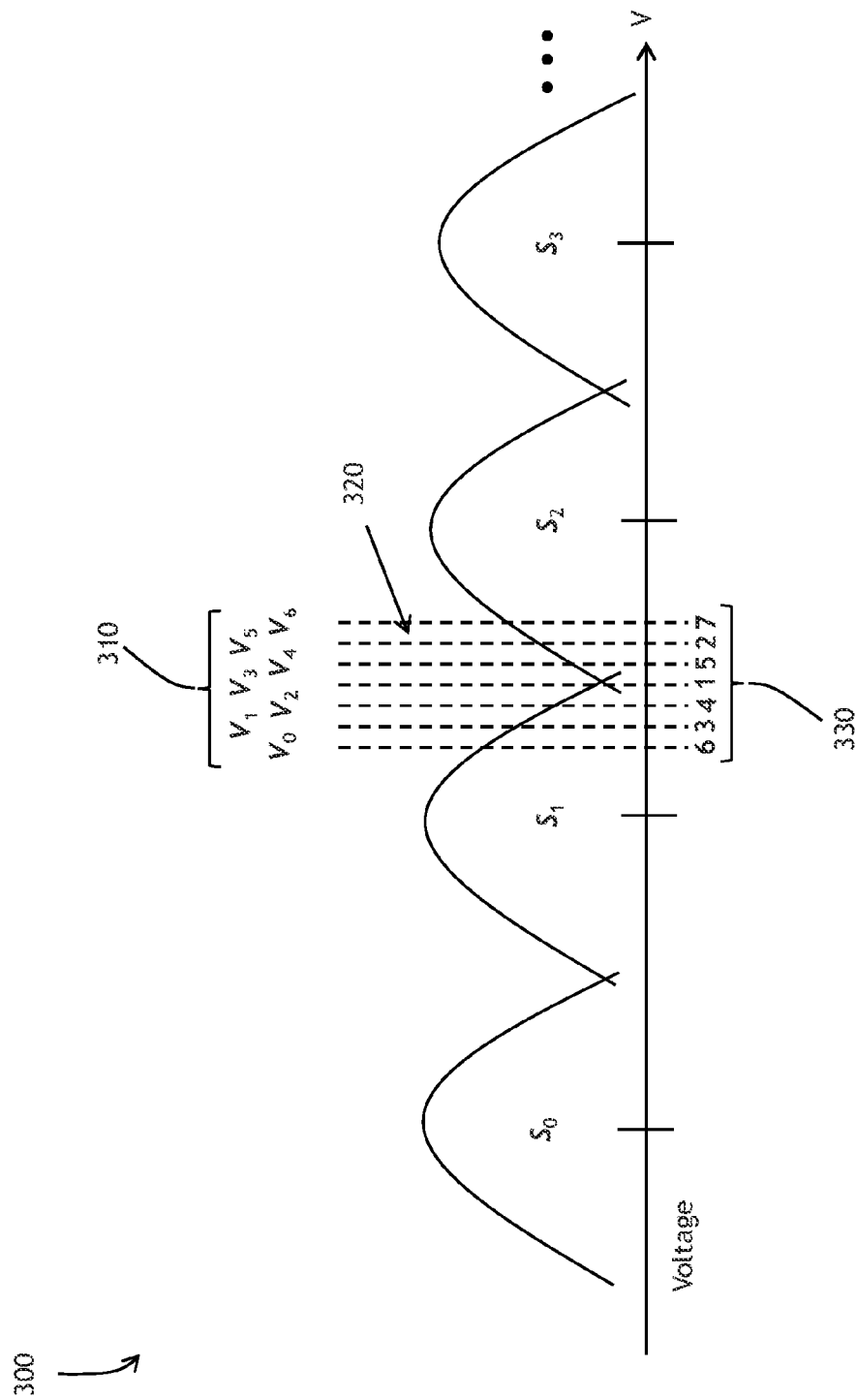
FIG. 3 is a graph of an exemplary number of ordered reads performed on a Least Significant Bit (LSB) lower page in accordance with an embodiment of the present invention.

Referring to FIG. 3, a graph of an exemplary number of ordered reads performed on a Least Significant Bit (LSB) lower page in accordance with an embodiment of the present invention is shown. Method 300 presents variable dimensions in which to determine the read voltages. Equally spaced reads $V_0$ through $V_6$ are indicated in group 310. An equal spacing 320 between reads simplifies method 300 to enable a less complicated read process. Method 300 determines a limited number of reads as the analysis of the group provides the desired BER. Method 300 provides desired spacing between reads and also provides an order 330 of reads to achieve a desired BER.

Method 300 determines an order 330 of reads to achieve a desired BER and ultimately, to achieve a desired channel capacity. Method 300 determines the order 330 of reads in this example to be $V_3$, $V_5$, $V_1$, $V_2$, $V_4$, $V_0$, $V_6$ providing the optimum read spacing 320 and read order 330 to reduce the BER.

Figure 4:
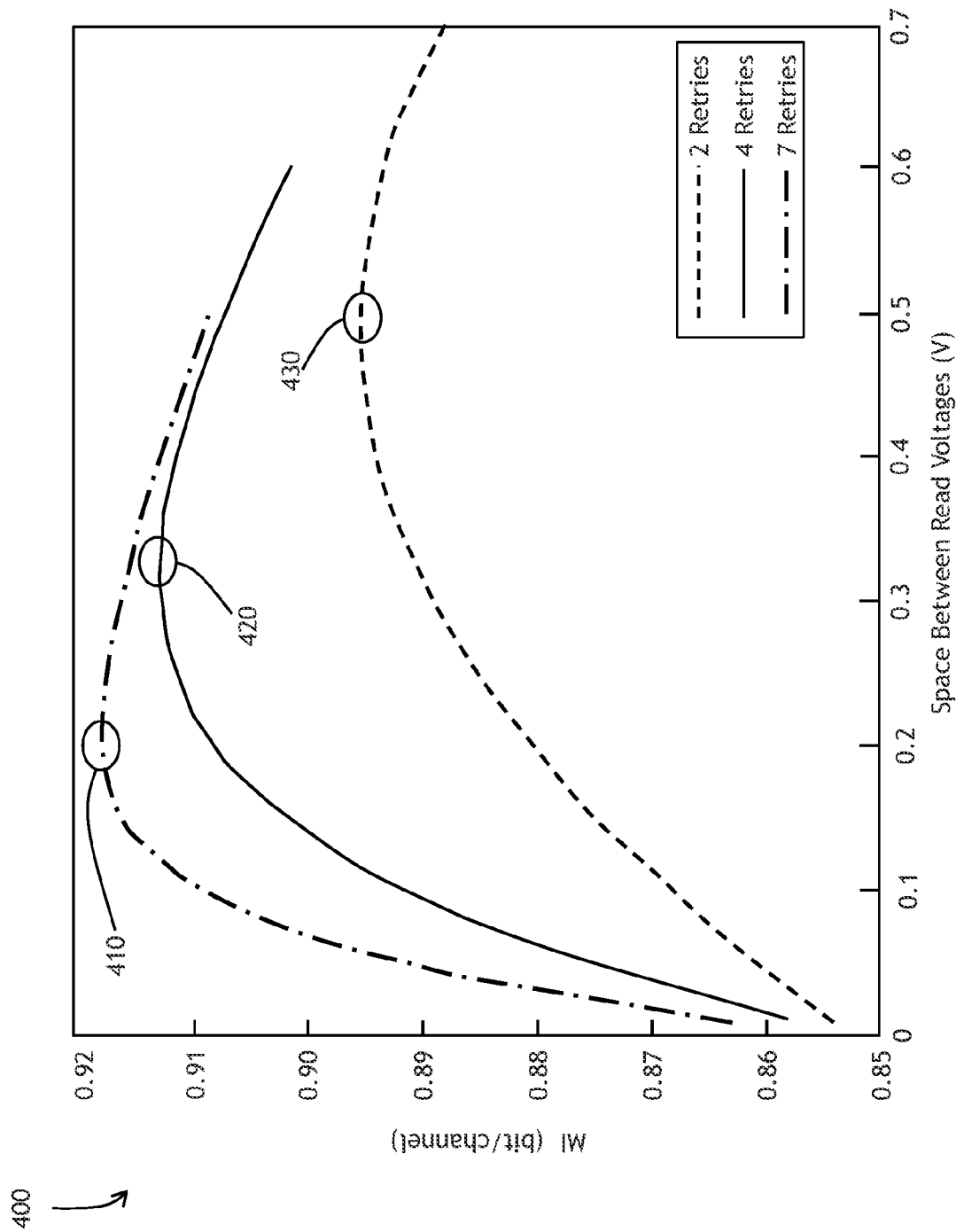
FIG. 4 is a graph of changing channel capacity Mutual Information (MI) with alternative spacing between read voltages in volts (V) in accordance with an embodiment of the present invention.

Referring to FIG. 4, a graph of changing channel capacity Mutual Information (MI) with alternative spacing between read voltages in volts (V) in accordance with an embodiment of the present invention is shown. Embodiments of the present invention provide for desired MI from an analysis 400 of spacing between read voltages and retries. With two retries, an optimum 430 space between read voltages is approximately 0.5 volts and the peak MI for two retries is approximately 0.0896 bits per channel.

With an increase in retries comes an increase in performance. At four retries, the optimum 420 space between retries is reduced to 0.32 and the peak MI rises to approximately 0.913 bits per channel. Similarly, at seven retries, optimum 410 spacing between read voltages reduces to 0.2 and MI increases to 0.918. This representation of method 300 performance indicates an exemplary seven retries returns a sufficient MI to permit desired operation of the channel. Specifically, as retries increase, very little additional performance is indicated by the channel.

Alternatively, an increased number of retries results in a decrease in overall BER. For example, an increase in the number of retries to 21 may allow for a greatly decreased BER without adding to the power, time and software requirements of the SSD controller tasked with the work.

It is contemplated herein, a desired number of retries is one defined as a number where BER slope flattens with increasing number of retries while the SSD controller processing time remains constant. With increasing SSD controller resources, an increased number of retries can be accomplished lowering BER while maintaining optimal SSD controller performance. In this configuration, a desired number of reads is limited by SSD controller capabilities.

Combining this information with an upper page of an MLC from FIG. 2, method 300 sets fourteen read reference voltages. This indicates method 300 performance of soft retry is an issue of 14-dimensional optimization. The simplicity of equal space between retries combined with limiting the number of retries creates the variable of at which reference voltage to place each set of reads. Of note, to achieve desired throughput performance (MI), a smaller number of retries requires larger space between read voltages.

Embodiments of the present invention provide for a method for determining a reference voltage at which the retry voltage is read, the spacing between each retry is equal, and the number of retries is constant. Method 300 reaches a BER close to that if the number of reads was significantly greater. For example, if method 300 commanded a theoretical infinite number of reads, a best possible (lowest) BER may result. Conversely, if method 300 commanded a single read, a highest BER may result. Method 300 commands an exemplary seven reads to reach a desired number of reads for simplicity, yet a number of reads sufficient to create an acceptable BER.

Figure 5:
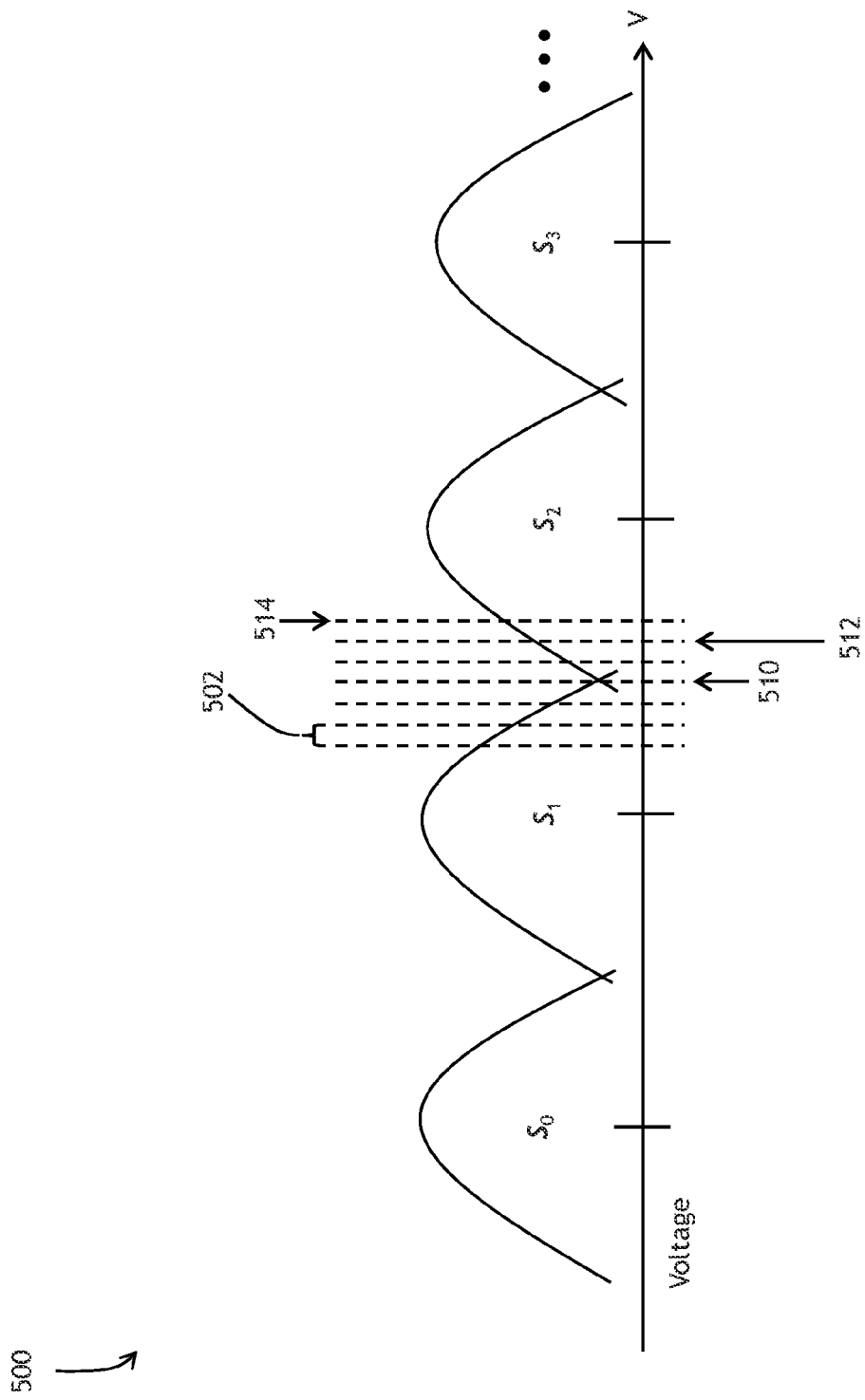
FIG. 5 is a graph of an exemplary number of reads spaced and ordered in accordance with an embodiment of the present invention.

Referring to FIG. 5, a graph of an exemplary number of reads spaced and ordered in accordance with an embodiment of the present invention is shown.

BER Oriented Read Location

Embodiments of the present invention provide for an equal spacing between each read, constant spacing between each read, limiting the number of retries, and determining the set of retries so the last of the retries read is located for a desired BER. Method 500 first determines a desired number of retries to allow. For example, method 500 may determine seven is the limited number of retries to read. Method 500 sets the spacing 502 between read voltages, the spacing is based on the number of retries allowed and a desired reference voltage for the last retry read. This desired reference voltage ensures the best possible BER will result after the last read regardless of the order of prior reads.

Throughput Oriented Reads

Embodiments of the present invention provide for determining each read reference voltage resulting in a desired throughput. For a first read, an optimal reference voltage includes that of a hard decision read. For example, a first read 510 located at the merger of a first PDF $S_1$ and a second PDF $S_2$ provides a first read optimized for desired throughput. Additionally, method 500 analyzes characterization data to determine the reference voltage of the each read.

If the first read fails, a larger space is desired between the failed first read and the second retry to reach the desired BER. Method 500 selects one of the reference voltages that is not proximal to the first read. Method 500 determines, for example, a voltage read 512 located more than one iteration of the spacing distant from the first read will result in the optimal throughput for the set of reads. Additional reads may follow the second retry at reference voltages greater or less than the first and second voltage read reference voltages. Final retry 514 previously determined based on desired BER completes the retry reading scheme.

Additionally, a tracking algorithm may provide reference voltages for the first read based on a hard decision read. For example, a tracking algorithm may indicate to method 500 that first read 510 is located offset at a greater or lesser voltage than the indicated reference voltage in FIG. 5. In this case, method 500 computes variables of spacing 502 and reference voltage of the last read 514 based on desired BER and throughput.

An additional embodiment of the present includes a non-transitory computer readable medium having computer readable program code embodied therein for optimizing Solid State Drive (SSD) soft retry voltages, the computer readable program code comprising instructions which, when executed by a computer device or processor, perform and direct the steps of determining a first reference voltage for a first soft retry voltage read, the first reference voltage based on a hard decision read, reading the first soft retry voltage at the first reference voltage, determining if the first soft retry voltage read fails, the determining based on an analysis of the first soft retry voltage read, determining a spacing between the first reference voltage and reference voltages for each one of a plurality of additional soft retry voltage reads, the spacing based on at least one of: the first soft retry voltage read and a desired bit error rate, the spacing being constant, determining a number of soft retry voltages to be read, the number based on a type of solid state drive, reading a second soft retry voltage from the plurality of additional soft retry voltage reads at a second reference voltage, the second reference voltage at least one iteration of the spacing distant from the first reference voltage, if the first soft retry voltage read fails, reading the second soft retry voltage at a multiple of iterations of the spacing distant from the first reference voltage, the multiple based on an analysis of a characterization data, the multiple greater than or equal to two, reading each one of the plurality of additional soft retry voltage reads at the reference voltages, each of the reference voltages at least one iteration of the spacing distant from a previous reference voltage, and correcting a channel of a memory based on the reading.

An additional embodiment of the present includes a first reference voltage based on at least one Program Erase Cycle (PEC) and further based on an input from a channel tracking algorithm.

An additional embodiment of the present includes determining if the first soft retry voltage read fails based on analysis of the voltage read and determining a spacing between the first reference voltage and reference voltages for each one of a plurality of additional soft retry voltage reads based on analysis of the PEC.

An additional embodiment of the present includes a number of soft retry voltages to be read is less than ten and the second reference voltage is two iterations of the spacing distant from the first reference voltage. Additionally, reading each one of the plurality of additional soft retry voltage reads at the reference voltages further includes reference voltages based on: 1) the number of reads, 2) a reference voltage of a last read and 3) the spacing.

An additional embodiment of the present includes the reference voltage of the last read is based on an optimal BER and optimizing a channel throughput include optimizing a SLC channel, a MLC channel, a TLC channel and a channel sized of at least four bits per cell.

Embodiments of the present invention reduce complicated read voltage optimization to a simple task. With simplicity comes less power and time to perform the task.

Figure 6:
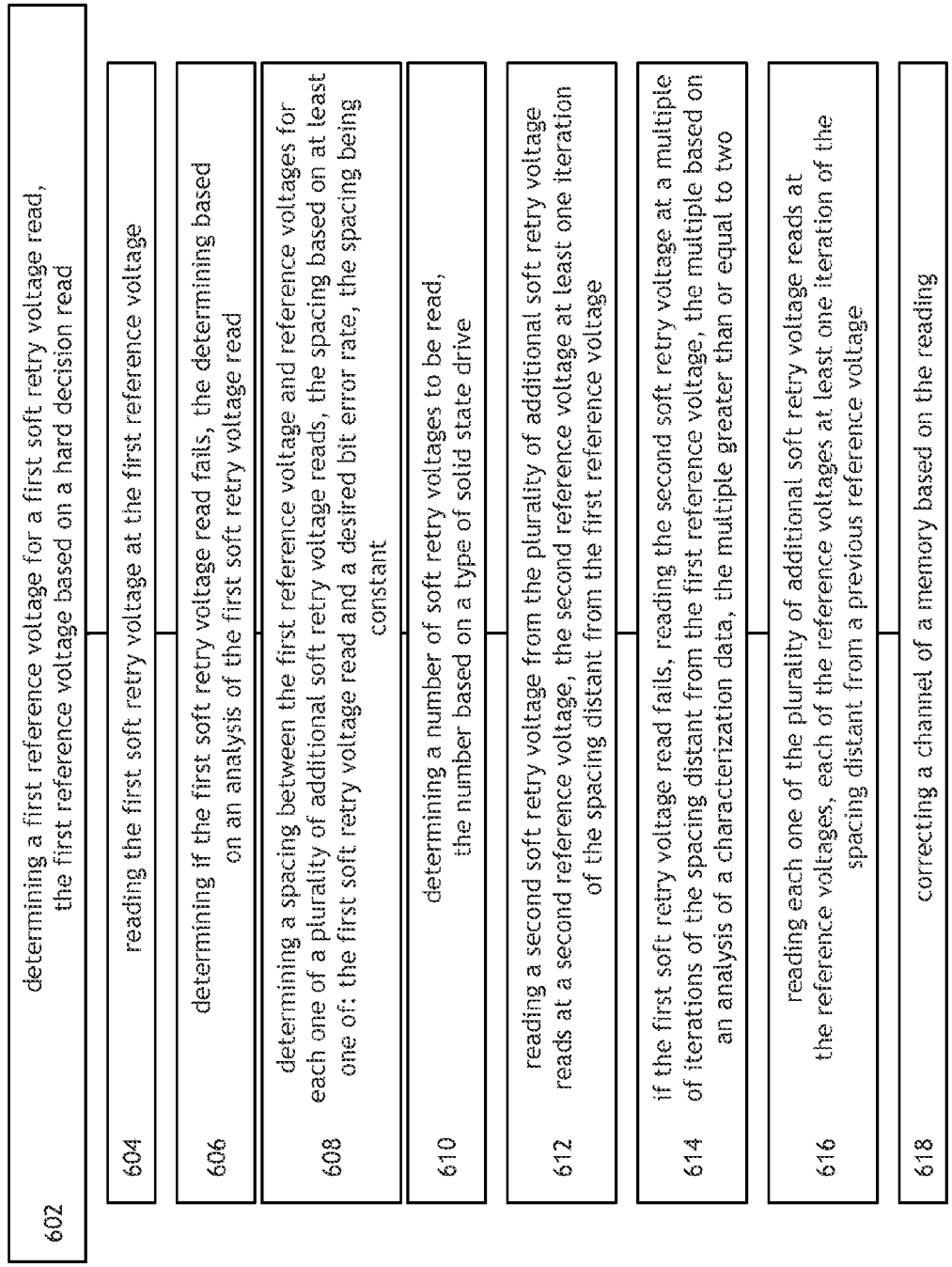
FIG. 6 is a flowchart detailing a method for optimizing SSD soft retry voltages in accordance with an embodiment of the present invention.

Referring to FIG. 6, a flowchart detailing a method for optimizing SSD soft retry voltages in accordance with an embodiment of the present invention is shown. Method 600 begins at step 602 with determining a first reference voltage of a first soft retry voltage read, the first reference voltage based on an optimal hard decision read, and, at step 604 with reading the first soft retry voltage at the first reference voltage, and, at step 606 with determining if the first soft retry voltage read fails, and, at step 608 with determining a spacing between the first reference voltage and reference voltages for each one of a plurality of additional soft retry voltage reads, the spacing based on at least one of: the first soft retry voltage read and a desired Bit Error Rate (BER), the spacing being constant. Method 600 continues at step 610 with determining a number of soft retry voltages to be read, the number based on a type of SSD, and, at step 612 with reading a second soft retry voltage from the plurality of additional soft retry voltage reads at a second reference voltage, the second reference voltage at least one iteration of the spacing distant from the first reference voltage, and, at step 614 with if the first soft retry voltage read fails, reading the second soft retry voltage at a multiple of iterations of the spacing distant from the reference voltage, the multiple based on an analysis of a characterization data, the multiple greater than or equal to 2, and, at step 616 with reading each one of the plurality of additional soft retry voltage reads at the reference voltages, the reference voltages at least one iteration of the spacing distant from a previous reference voltage, and, method 600 completes at step 618 with optimizing a channel throughput and the BER based on the reading.

CONCLUSION

Specific blocks, sections, devices, functions, processes and modules may have been set forth. However, a skilled technologist will realize that there may be many ways to partition the method and system, and that there may be many parts, components, processes, modules or functions that may be substituted for those listed above.

While the above detailed description has shown, described and pointed out the fundamental novel features of the invention as applied to various embodiments, it will be understood that various omissions and substitutions and changes in the form and details of the method and system illustrated may be made by those skilled in the art, without departing from the intent of the invention. The foregoing description details certain embodiments of the invention. It will be appreciated, however, that no matter how detailed the foregoing appears, the invention may be embodied in other specific forms without departing from its spirit or essential characteristics. The described embodiment is to be considered in all respects as illustrative and not restrictive and the scope of the invention is, therefore, indicated by the appended claims rather than by the foregoing description. All changes which come within the meaning and range of equivalency of the claims may be to be embraced within their scope.

In the present disclosure, the methods disclosed may be implemented as sets of instructions or software readable by a device. Further, it is understood that the specific order or hierarchy of steps in the methods disclosed may be examples of exemplary approaches. Based upon design preferences, it is understood that the specific order or hierarchy of steps in the method can be rearranged while remaining within the disclosed subject matter. The accompanying claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for optimizing solid state drive soft retry voltages, comprising:
    determining a first reference voltage for a first soft retry voltage read, the first reference voltage based on a hard decision read;
    reading a first soft retry voltage at the first reference voltage;
    determining if the first soft retry voltage read fails, the determining based on an analysis of the first soft retry voltage read;
    determining a spacing between the first reference voltage and reference voltages for each one of a plurality of additional soft retry voltage reads, the spacing based on the first soft retry voltage read and a desired bit error rate, the spacing being constant;
    determining a number of soft retry voltages to be read, the number based on a type of solid state drive;
    reading a second soft retry voltage from the plurality of additional soft retry voltage reads at a second reference voltage, the second reference voltage at least one iteration of the spacing distant from the first reference voltage;
    if the first soft retry voltage read fails, then reading the second soft retry voltage at a multiple of iterations of the spacing distant from the first reference voltage, the multiple based on an analysis of a characterization data, the multiple greater than or equal to two;
    reading each one of the plurality of additional soft retry voltage reads at their respective reference voltages, each of the reference voltages at least one iteration of the spacing distant from a previous reference voltage; and
    correcting a channel of a memory based on a reading.

2. The method for optimizing solid state drive soft retry voltages of claim 1, wherein the first soft retry voltage read further comprises a number of soft retry voltages read, the number of soft retry voltages read based on a memory page type and a memory type.

3. The method for optimizing solid state drive soft retry voltages of claim 1, wherein the first reference voltage of a first soft retry voltage read further comprises a first particular reference voltage based on at least one program erase cycle.

4. The method for optimizing solid state drive soft retry voltages of claim 1, wherein the first reference voltage of a first soft retry voltage read further comprises a second particular reference voltage based on an input from a channel tracking algorithm.

5. The method for optimizing solid state drive soft retry voltages of claim 1, wherein determining a spacing between the first reference voltage and reference voltages for each one of a plurality of additional soft retry voltage reads further comprises determining the spacing based on analysis of the program erase cycle.

6. The method for optimizing solid state drive soft retry voltages of claim 1, wherein reading a second soft retry voltage from the plurality of additional soft retry voltage reads at a second reference voltage further comprises shifting a number of soft retry voltage reads, in parallel, a number of iterations of the spacing greater or less than the reference voltage of the first soft retry voltage read.

7. The method for optimizing solid state drive soft retry voltages of claim 1, wherein the second reference voltage is at least two iterations of the spacing distant from the first reference voltage and the number of soft retry voltages to be read is less than ten.

8. The method for optimizing solid state drive soft retry voltages of claim 1, wherein reading each one of the plurality of additional soft retry voltage reads at the reference voltages further comprises reference voltages based on at least two of: the number of reads, a reference voltage of a last read and the spacing.

9. The method for optimizing solid state drive soft retry voltages of claim 8, wherein the reference voltage of the last read is based on a desired bit error rate.

10. The method for optimizing solid state drive soft retry voltages of claim 1, wherein correcting a channel of a memory based on the reading further comprises correcting a SLC channel, a MLC channel, a TLC channel, and a channel sized to carry at least four bits per cell.

11. A non-transitory computer readable medium having computer readable program code embodied therein for optimizing solid state drive soft retry voltages, the computer readable program code comprising instructions which, when executed by a computer device or processor, perform and direct the steps of:
    determining a first reference voltage for a first soft retry voltage read, the first reference voltage based on a hard decision read;
    reading a first soft retry voltage at the first reference voltage;
    determining if the first soft retry voltage read fails, the determining based on an analysis of the first soft retry voltage read;

determining a spacing between the first reference voltage and reference voltages for each one of a plurality of additional soft retry voltage reads, the spacing based on the first soft retry voltage read and a desired bit error rate, the spacing being constant;

determining a number of soft retry voltages to be read, the number based on a type of solid state drive;

reading a second soft retry voltage from the plurality of additional soft retry voltage reads at a second reference voltage, the second reference voltage at least one iteration of the spacing distant from the first reference voltage;

if the first soft retry voltage read fails, then reading the second soft retry voltage at a multiple of iterations of the spacing distant from the first reference voltage, the multiple based on an analysis of a characterization data, the multiple greater than or equal to two;

reading each one of the plurality of additional soft retry voltage reads at their respective reference voltages, each of the reference voltages at least one iteration of the spacing distant from a previous reference voltage; and correcting a channel of a memory based on a reading.

12. The computer readable medium of claim 11, wherein the first soft retry voltage read further comprises a number of soft retry voltages read, the number of soft retry voltages read based on a memory page type and a memory type.

13. The computer readable medium of claim 11, wherein the first reference voltage of a first soft retry voltage read further comprises a first particular reference voltage based on at least one program erase cycle.

14. The computer readable medium of claim 11, wherein the first reference voltage of a first soft retry voltage read further comprises a second particular reference voltage based on an input from a channel tracking algorithm.

15. The computer readable medium of claim 11, wherein determining a spacing between the first reference voltage and reference voltages for each one of a plurality of additional soft retry voltage reads further comprises determining the spacing based on analysis of the program erase cycle.

16. The computer readable medium of claim 11, wherein reading a second soft retry voltage from the plurality of additional soft retry voltage reads at a second reference voltage further comprises shifting a number of soft retry voltage reads, in parallel, a number of iterations of the spacing greater or less than the reference voltage of the first soft retry voltage read.

17. The computer readable medium of claim 11, wherein the second reference voltage is at least two iterations of the spacing distant from the first reference voltage and the number of soft retry voltages to be read is less than ten.

18. The computer readable medium of claim 11, wherein reading each one of the plurality of additional soft retry voltage reads at the reference voltages further comprises reference voltages based on at least two of: the number of reads, a reference voltage of a last read and the spacing.

19. The computer readable medium of claim 18, wherein the reference voltage of the last read is based on a desired bit error rate.

20. The computer readable medium of claim 11, wherein correcting a channel of a memory based on the reading further comprises correcting a SLC channel, a MLC channel, a TLC channel, and a channel sized to carry at least four bits per cell.

* * * * *